(12) United States Patent
Tai et al.

(10) Patent No.: US 9,986,192 B1
(45) Date of Patent: May 29, 2018

(54) THROUGH-SEMICONDUCTOR AND THROUGH-DIELECTRIC ISOLATION STRUCTURE

(71) Applicant: OMNIVISION TECHNOLOGIES, INC., Santa Clara, CA (US)

(72) Inventors: Dyson H. Tai, San Jose, CA (US); Duli Mao, Sunnyvale, CA (US); Vincent Venezia, Los Gatos, CA (US); Gang Chen, San Jose, CA (US); Chih-Wei Hsiung, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days. days.

(21) Appl. No.: 15/362,402

(22) Filed: Nov. 28, 2016

(51) Int. Cl.
*H04N 5/378* (2011.01)
*H01L 27/146* (2006.01)

(52) U.S. Cl.
CPC ......... *H04N 5/378* (2013.01); *H01L 27/1463* (2013.01); *H01L 27/1464* (2013.01); *H01L 27/14636* (2013.01); *H01L 27/14643* (2013.01)

(58) Field of Classification Search
None
See application file for complete search history.

(56) References Cited

U.S. PATENT DOCUMENTS

| 9,160,953 | B2 | 10/2015 | Oishi | |
| 2015/0115388 | A1* | 4/2015 | Eda | H01L 27/14612 257/446 |
| 2016/0112614 | A1* | 4/2016 | Masuda | H01L 27/14621 348/374 |

* cited by examiner

*Primary Examiner* — Mark T Monk
(74) *Attorney, Agent, or Firm* — Christen O'Connor Johnson Kindness PLLC

(57) ABSTRACT

An image sensor includes a semiconductor material including a photodiode disposed in the semiconductor material and an insulating material. A surface of the semiconductor material is disposed between the insulating material and the photodiode. The image sensor also includes isolation structures disposed in the semiconductor material and in the insulating material, and the isolation structures extend from within the semiconductor material through the surface and into the insulating material. The isolation structures include a core material and a liner material. The liner material is disposed between the core material and the semiconductor material, and is also disposed between the insulating material and the core material.

18 Claims, 5 Drawing Sheets

THROUGH-SEMICONDUCTOR AND THROUGH-DIELECTRIC ISOLATION STRUCTURE

TECHNICAL FIELD

This disclosure relates generally to semiconductor fabrication, and in particular but not exclusively, relates to isolation trench fabrication.

BACKGROUND INFORMATION

Image sensors have become ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices.

The typical image sensor operates as follows. Image light from an external scene is incident on the image sensor. The image sensor includes a plurality of photosensitive elements such that each photosensitive element absorbs a portion of incident image light. Photosensitive elements included in the image sensor, such as photodiodes, each generate image charge upon absorption of the image light. The amount of image charge generated is proportional to the intensity of the image light. The generated image charge may be used to produce an image representing the external scene.

The miniaturization of image sensors may result in a decreased distance between neighboring photosensitive elements. As the distance between photosensitive elements decreases, the likelihood and magnitude of both electrical and optical crosstalk between photosensitive elements may increase.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1A:
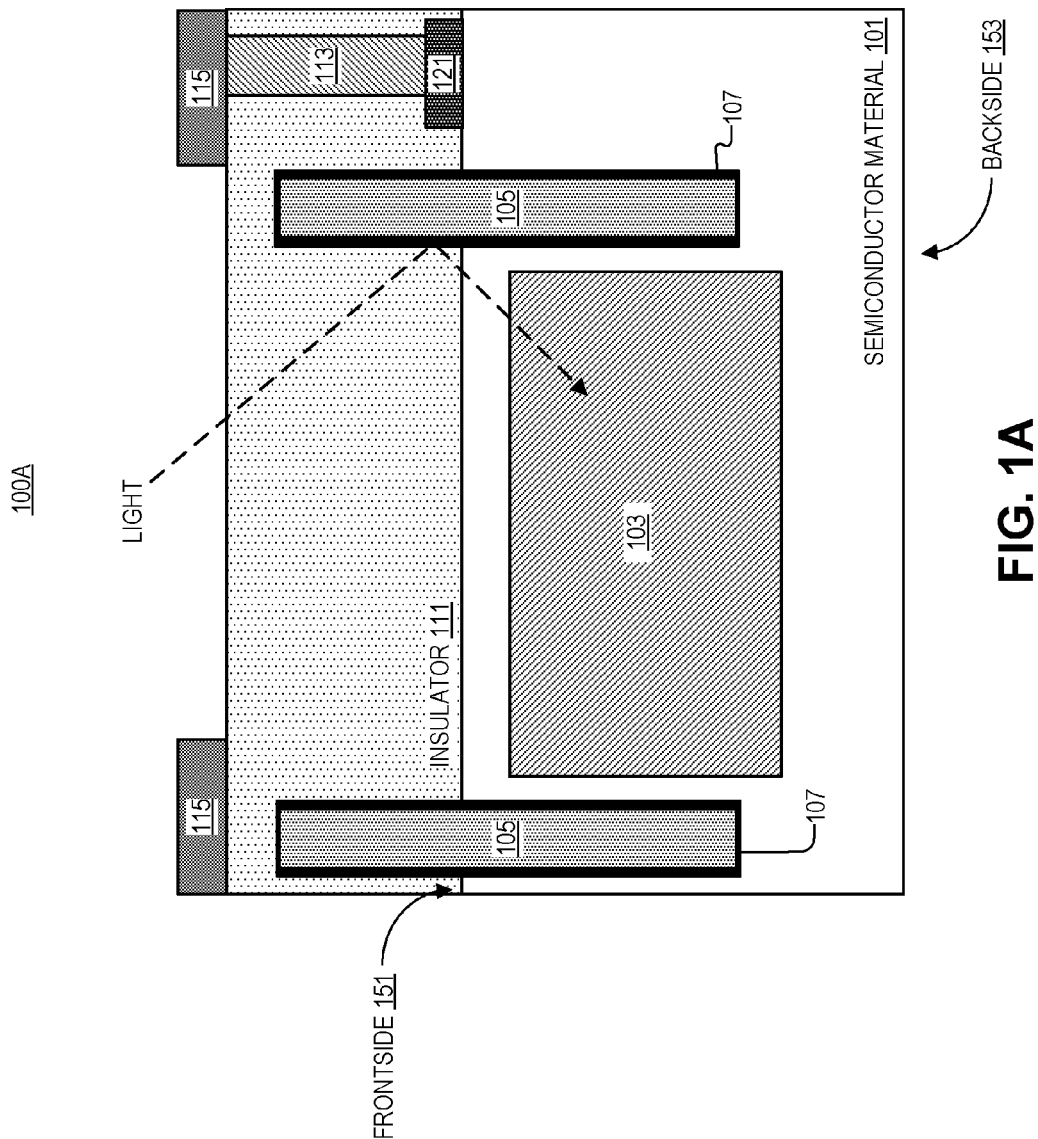
FIG. 1A is a cross sectional illustration of an example frontside illuminated image sensor with isolation structures, in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for through-semiconductor and through-dielectric isolation structures are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

FIG. 1A is a cross sectional illustration of an example frontside illuminated image sensor 100A with isolation structures. Image sensor 100A includes semiconductor material 101, photodiode 103, insulating material 111, isolation structures (including core material 105 and liner material 107), transfer gate 121, contact 113, electrical interconnects 115, frontside 151, and backside 153.

Photodiode 103 is disposed in semiconductor material 101. Insulating material 111 is disposed proximate to semiconductor material 101 such that a surface of semiconductor material 101 is disposed between insulating material 111 and photodiode 103. Isolation structures are disposed in semiconductor material 101 and in insulating material 111. Isolation structures extend from within semiconductor material 101 into insulating material 111 and, as stated, isolation structures include core material 105 and liner material 107. Liner material 107 is disposed between core material 105 and semiconductor material 101, and is also disposed between insulating material 111 and core material 105. In the depicted example, individual isolation structures are disposed on opposite sides of photodiode 103, and liner material 107 includes a dielectric material (e.g., high-k oxide or the like), and core material 105 includes a conductive material (e.g., a semiconductor, metal, or the like). As illustrated, insulating material 111 is disposed on the frontside 151 of semiconductor material 101, and image light enters the frontside 151 of semiconductor material 101 and is absorbed by photodiode 103.

In the depicted example, isolation structures are at least in part vertically coextensive with photodiode 103 to reflect the image light that is oblique to the frontside 151 surface of image sensor 100A into photodiode 103. The isolation structures may extend from a surface of the semiconductor material 101 to be coextensive with part of photodiode 103, but may not extend all the way through semiconductor material 101. The location of the isolation structures may help to prevent optical cross talk. Moreover, since liner material 107 includes a dielectric, and the isolation structures extend through the interface of semiconductor material 101 and insulating material 111, the isolation structures may be used to prevent electrical crosstalk. In examples where liner material 107 includes a negatively charged material such as a high-k oxide, liner material 107 may pin surface charges by accumulating positive charge in semiconductor material 101, preventing the charges from flowing between neighboring photodiodes 103, in accordance with the teachings of the present disclosure. In one example, microlenses/color filters may be placed on top of insulating material 111 and between the incident light and photodiodes 103.

Figure 1B:
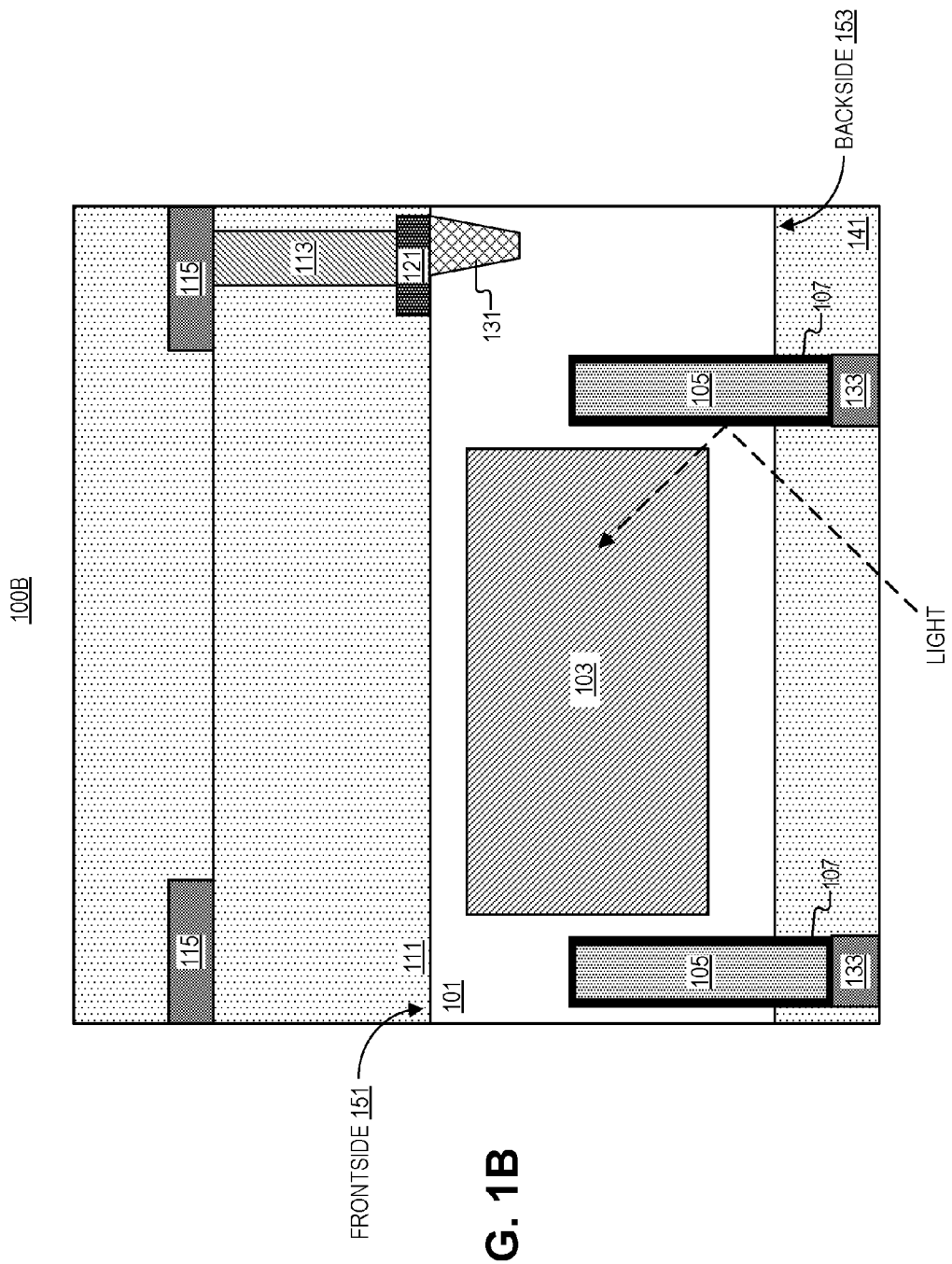
FIG. 1B is a cross sectional illustration of an example backside illuminated image sensor with isolation structures, in accordance with the teachings of the present invention.

FIG. 1B is a cross sectional illustration of an example backside illuminated image sensor 100B with isolation structures. Image sensor 100B is similar to image sensor 100A in many respects. However, as shown in the illustrated example, insulating material 141 is disposed on the backside 153 (opposite frontside 151) of semiconductor material 101, and image light enters the backside 153 of semiconductor material 101 and is absorbed by photodiode 103. One skilled in the art will appreciate that a frontside of an image sensor is defined by the side of the sensor including circuitry (e.g., metal interconnects), and the backside is the side without the circuitry—or at least the side with less circuitry.

Another difference is that image sensor 100B further includes metal caps 133, such that isolation structures are vertically disposed between metal caps 133 and the semiconductor material 101. In other words, in a vertical direction (relative to the figure orientation) core material 105 is disposed between metal caps 133 and semiconductor material 101. However, in some examples, metal caps 133 may not be included in image sensor 100B and may simply be replaced with insulating material 141. In the depicted example, insulating materials 111 and 141 may be the same or different materials (e.g., oxides, nitrides, or the like).

As illustrated, electrical interconnects 115 may be electrically coupled to transfer gate 121 which may be disposed proximate to shallow trench isolation structure 131 in the semiconductor material 101. Shallow trench isolation structures 131 may be used to reduce electrical crosstalk between photodiodes 103 or other pieces of circuitry disposed on the frontside 151 of the device.

Figure 1C:
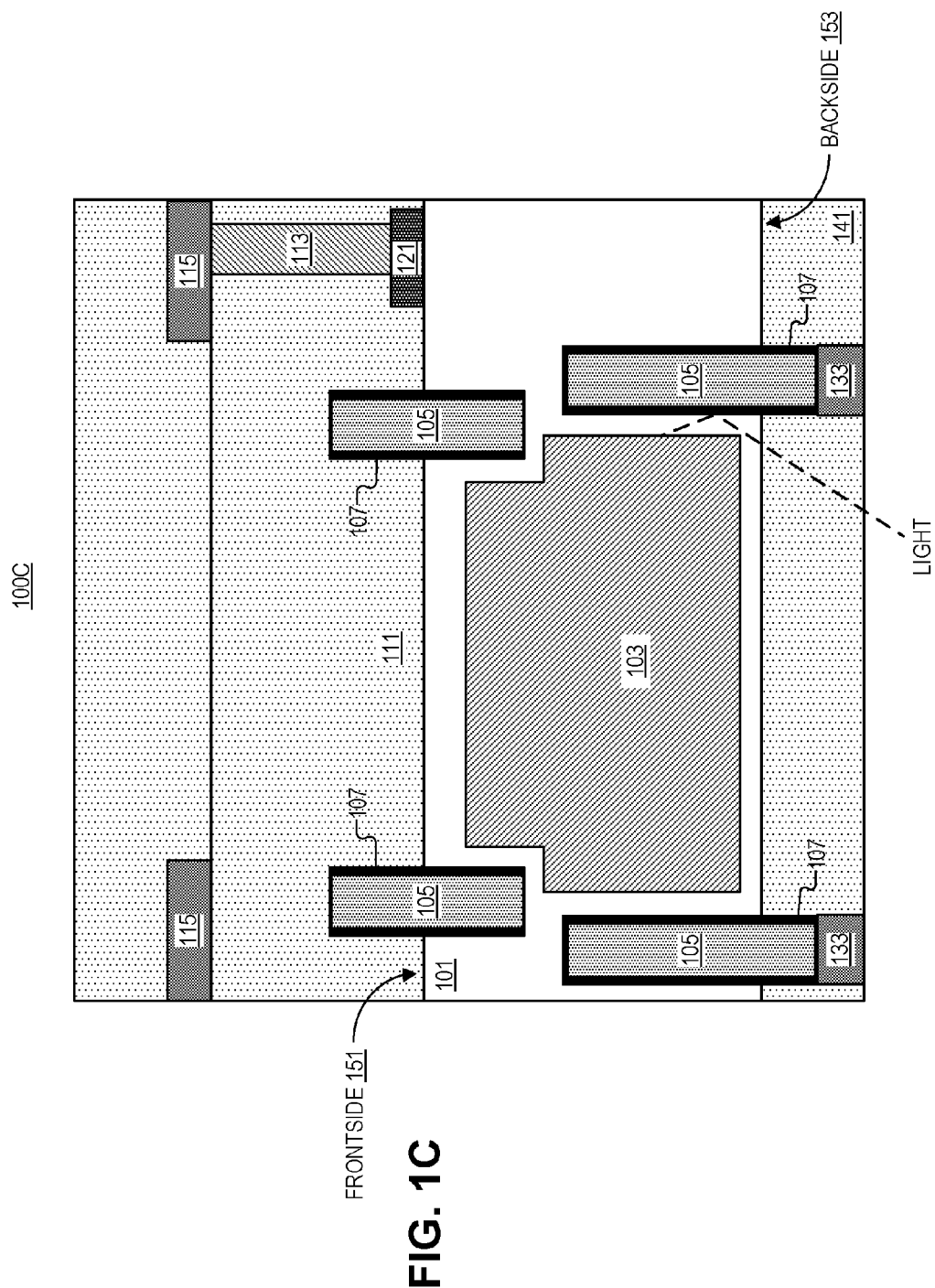
FIG. 1C is a cross sectional illustration of an example backside illuminated image sensor with isolation structures, in accordance with the teachings of the present invention.

FIG. 1C is a cross sectional illustration of an example backside illuminated image sensor 100C with isolation structures. Image sensor 100C is similar in many respects to image sensor 100B of FIG. 1B; however, second isolation structures are disposed in semiconductor material 101 and in second insulating material 111, and the second isolation structures extend from within semiconductor material 101, through the frontside 151 of semiconductor material 101, and into second insulating material 111. The second isolation structures may be used to electrically isolate photodiode 103 on the frontside 151 of image sensor 100C by pinning surface charges proximate to the frontside 151. In some examples, insulating materials 111 and 141 may have the same or different chemical compositions.

In the depicted example, the second isolation structures are vertically coextensive with a portion of photodiode 103, and the portion of photodiode 103 proximate to the second isolation structures has a smaller lateral cross sectional area than the bulk of photodiode 103. In other words, photodiode 103 has a large portion and a small portion, and the second isolation structures are disposed proximate to recesses which define the small portion. In the illustrated example, the isolation structures are disposed at least in part in the recessed regions in photodiode 103. Moreover, in the illustrated example, the lateral distance between the second isolation structures is smaller than the lateral distance between the isolation structures. Thus the two sets of isolation structures may not be vertically aligned. However, one skilled in the art will appreciate that in other examples, the lateral distance between the second isolation structures may be greater than, or the same as, the lateral distance between the isolation structures. Also shown is that second isolation structures are entirely contained within semiconductor material 101 and insulating material 111. In other words, second isolation structures are entirely encapsulated between the two materials/layers.

As in FIGS. 1A & 1B metal interconnects are disposed in insulating material 111, and electrical interconnects 115 are coupled (with contact 113, possibly including tungsten) to a transfer gate 121 disposed proximate to semiconductor material 101 to extract image charge from photodiode 103. Transfer gate 121 may be directly or indirectly coupled to a floating diffusion to output the image charge to readout circuitry.

Figure 2:
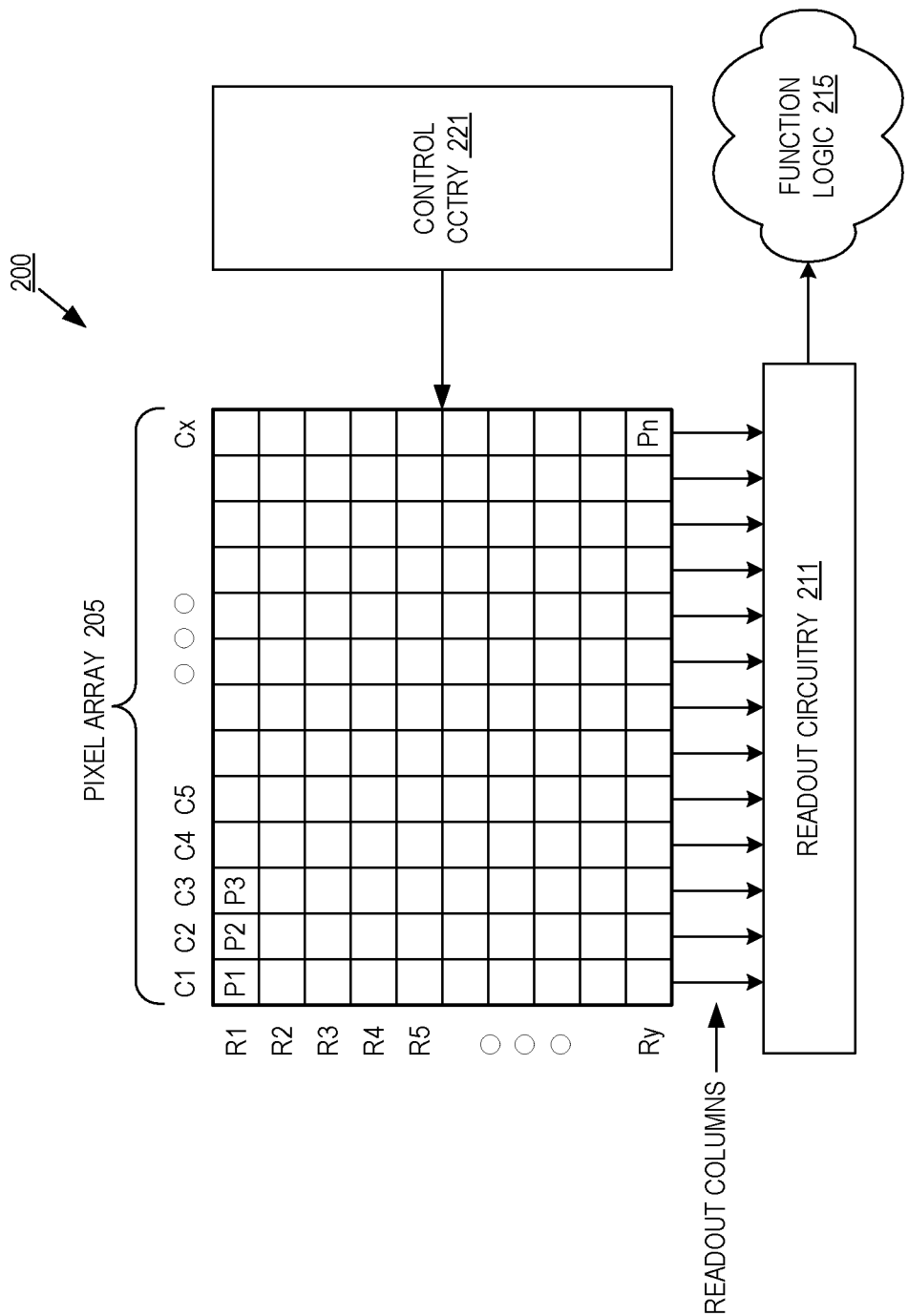
FIG. 2 is a block diagram illustrating one example of an imaging system which may include the image sensor of FIGS. 1A-1C, in accordance with the teachings of the present invention.

FIG. 2 is a block diagram illustrating one example of an imaging system which may include the image sensor of FIGS. 1A-1C. Imaging system 200 includes pixel array 205, control circuitry 221, readout circuitry 211, and function logic 215. In one example, pixel array 205 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, photodiodes do not have to be arranged into rows and columns and may take other configurations.

In one example, after each image sensor photodiode/pixel in pixel array 205 has acquired its image data or image charge, the image data is readout by readout circuitry 211 and then transferred to function logic 215. In various examples, readout circuitry 211 may include amplification circuitry, analog-to-digital (ADC) conversion circuitry, or otherwise. Function logic 215 may simply store the image data or even manipulate the image data by applying post image effects (e.g., crop, rotate, remove red eye, adjust brightness, adjust contrast, or otherwise). In one example, readout circuitry 211 may readout a row of image data at a time along readout column lines (illustrated) or may readout the image data using a variety of other techniques (not illustrated), such as a serial readout or a full parallel readout of all pixels simultaneously.

In one example, control circuitry 221 is coupled to pixel array 205 to control operation of the plurality of photodiodes in pixel array 205. For example, control circuitry 221 may generate a shutter signal for controlling image acquisition. In the depicted example, the shutter signal is a global shutter signal for simultaneously enabling all pixels within pixel array 205 to simultaneously capture their respective image data during a single acquisition window. In another example, image acquisition is synchronized with lighting effects such as a flash.

In one example, imaging system 200 may be included in a digital camera, cell phone, laptop computer, automobile or the like. Additionally, imaging system 200 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 200, extract image data from imaging system 200, or manipulate image data supplied by imaging system 200.

Figure 3:
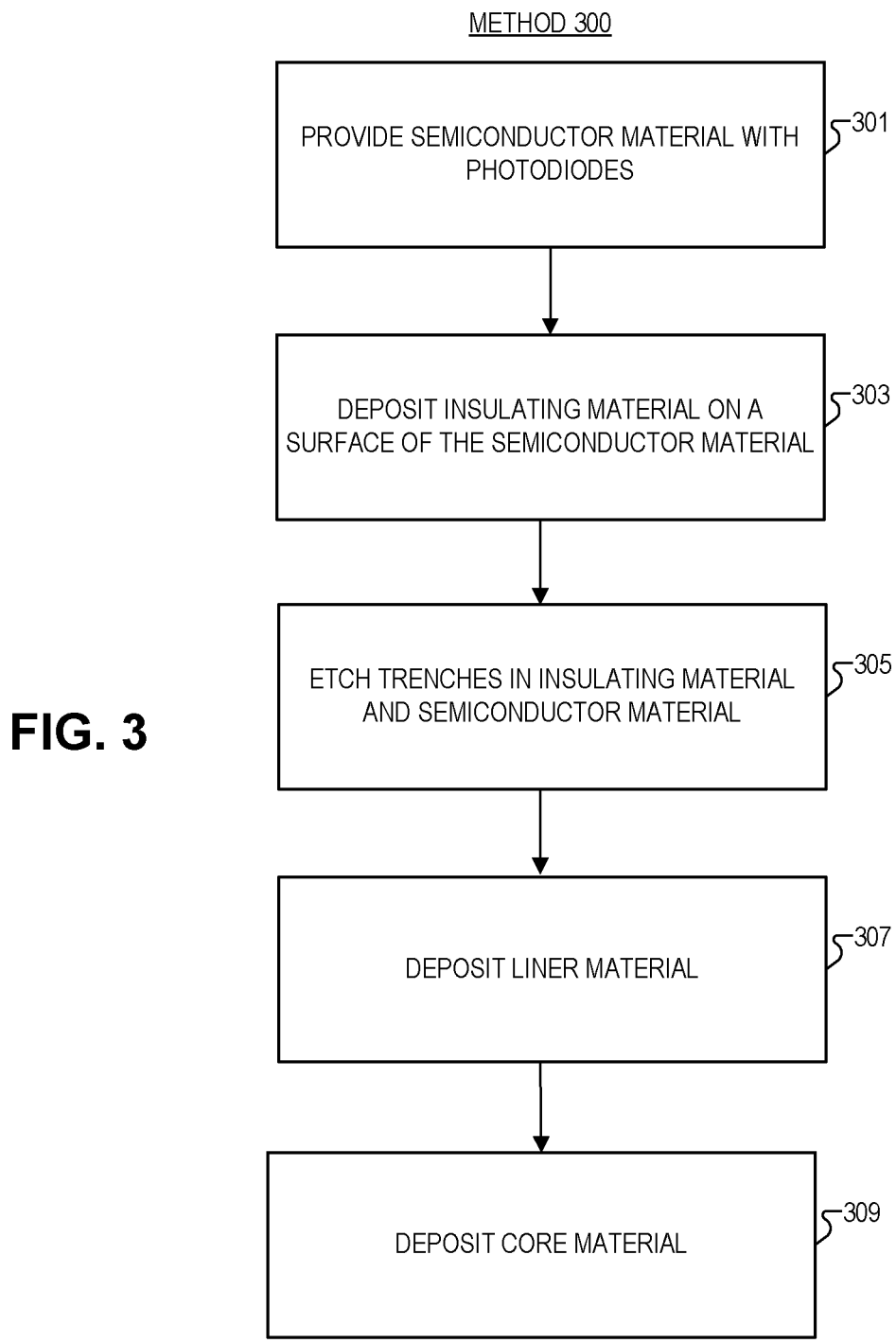
FIG. 3 illustrates an example method of image sensor fabrication, in accordance with the teachings of the present invention.

FIG. 3 illustrates an example method 300 of image sensor fabrication. The order in which some or all process blocks appear in method 300 should not be deemed limiting. Rather, one of ordinary skill in the art having the benefit of the present disclosure will understand that some of method 300 may be executed in a variety of orders not illustrated, or even in parallel. Furthermore, method 300 may omit certain process blocks in order to avoid obscuring certain aspects. Alternatively, method 300 may include additional process blocks that may not be necessary in some embodiments/examples of the disclosure.

Process block 301 describes providing a semiconductor material with photodiodes. In some examples the semiconductor material may include a silicon wafer with photodiodes disposed in an array within the wafer.

Process block 303 shows depositing an insulating material on the surface of the semiconductor material. In some examples there may be intervening layers between the insulating material and the surface of the semiconductor material (such as transfer gates, to extract charge from the plurality of photodiodes in the semiconductor material). As depicted in FIGS. 1A-1C, the surface that the insulating material is deposited on may be the frontside surface and/or the backside surface of the semiconductor material depending on if the image sensor is a frontside or backside illuminated image sensor.

Process block 305 illustrates etching trenches in the insulating layer and semiconductor layer; as illustrated in FIGS. 1A-1C trenches may continuously extend from within the semiconductor material to within the insulating material. Etching may include using either a wet or dry etch depending on the processing conditions needed to fabricate the isolation structures.

Process block 307 describes depositing the liner material in the trenches. In some examples, the liner material may be a negatively charged high-k oxide which may induce a positive charge in the surrounding semiconductor material. This may pin charged surface states and mitigate migration of charge between neighboring photodiodes. For example, the liner material (and the dielectric material) may include oxides/nitrides such as silicon oxide ($SiO_2$), hafnium oxide ($HfO_2$), silicon nitride ($Si_3N_4$), silicon oxynitride ($SiO_xN_y$), tantalum oxide ($Ta_2O_5$), titanium oxide ($TiO_2$), zirconium oxide ($ZrO_2$), aluminum oxide ($Al_2O_3$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), yttrium oxide ($Y_2O_3$), or the like. Additionally, one skilled in the relevant art, will recognize that any stoichiometric combination of the above metals/semiconductors and their oxides/nitrides/oxynitrides may be used, in accordance with the teachings of the present disclosure.

Process block 309 shows depositing the core material. In some examples, the core material is conductive such as a semiconductor material (which may or may not be doped) or a metal such as tungsten, aluminum, copper or the like. In examples where the core is reflective, the core material may reflect light incident on the image sensor and oblique to the illuminated surface, so that the light reflects into the proper photodiode. Thus the isolation structures may drastically reduce both optical and electrical crosstalk with a single piece of device architecture.

Although not depicted, after the core material is deposited, the trenches may be backfilled with insulating material or may be capped with metal caps depending on the specific geometry desired. Thus in some examples, the isolation structures are entirely encapsulated within the insulating material and semiconductor material with either the insulating material or the metal cap entirely enclosing the structures within the dielectric material and the semiconductor material.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:
    a semiconductor material including a photodiode disposed in the semiconductor material;
    an insulating material, wherein a surface of the semiconductor material is disposed between the insulating material and the photodiode; and
    isolation structures disposed in the semiconductor material and in the insulating material, wherein the isolation structures extend from within the semiconductor material through the surface and into the insulating material, and wherein the isolation structures include:
    a core material; and
    a liner material disposed between the core material and the semiconductor material, and disposed between the insulating material and the core material.

2. The image sensor of claim 1, wherein individual isolation structures are disposed on opposite sides of the photodiode, and wherein the liner material includes a dielectric material, and the core material includes a conductive material.

3. The image sensor of claim 2, wherein the liner material includes a high-k oxide and the core material includes at least one of a semiconductor or a metal.

4. The image sensor of claim 1, wherein the surface is a frontside of the semiconductor material, and wherein image light enters the frontside of the semiconductor material and is absorbed by the photodiode.

5. The image sensor of claim 4, wherein the isolation structures are at least in part vertically coextensive with the photodiode to reflect the image light that is oblique to the frontside into the photodiode.

6. The image sensor of claim 1, wherein the surface is a backside of the semiconductor material opposite a frontside, and wherein image light enters the backside of the semiconductor material and is absorbed by the photodiode.

7. The image sensor of claim 6, further comprising metal caps, wherein the isolation structures are vertically disposed between the metal caps and the semiconductor material.

8. The image sensor of claim 6, further comprising:
a second insulating material disposed proximate to the frontside of the semiconductor material, wherein the semiconductor material is disposed between the insulating material and the second insulating material; and
second isolation structures disposed in the semiconductor material and the second insulating material, wherein the second isolation structures extend from within the semiconductor material into the second insulating material.

9. The image sensor of claim 8, wherein the second isolation structures are vertically coextensive with a portion of the photodiode, wherein the portion of the photodiode has a smaller lateral cross sectional area than a bulk of the photodiode.

10. The image sensor of claim 8, wherein metal interconnects are disposed in the second insulating material, and wherein the metal interconnects are coupled to a transfer gate disposed proximate to the semiconductor material to extract image charge from the photodiode.

11. The image sensor of claim 8, wherein a first lateral distance between the second isolation structures is smaller than a second lateral distance between the isolation structures.

12. The image sensor of claim 1, wherein the isolation structures are entirely contained within the semiconductor material and the insulating material.

13. An imaging system comprising:
a plurality of photodiodes disposed in a semiconductor material, wherein individual photodiodes in the plurality of photodiodes are separated by isolation structures, and wherein individual isolation structures are disposed between individual photodiodes;
an insulating material disposed proximate to the semiconductor material, wherein a surface of the semiconductor material is disposed between the insulating material and the plurality of photodiodes, and wherein the isolation structures extend from within the semiconductor material into the insulating material through the surface of the semiconductor material, and wherein the isolation structures include a core material and a liner material disposed between the core material and the semiconductor material, and disposed between the insulating material and the core material;
control circuitry electrically coupled to control operation of the plurality of photodiodes; and
readout circuitry to extract image charge from the plurality of photodiodes.

14. The imaging system of claim 13, wherein the surface is a frontside of the semiconductor material, and wherein image light enters the plurality of photodiodes from the frontside of the semiconductor material, and wherein metal interconnects included in the control circuitry and readout circuitry are disposed proximate to the frontside.

15. An imaging system comprising:
a plurality of photodiodes disposed in a semiconductor material, wherein individual photodiodes in the plurality of photodiodes are separated by isolation structures, and wherein individual isolation structures are disposed between individual photodiodes;
an insulating material disposed proximate to the semiconductor material, wherein a surface of the semiconductor material is disposed between the insulating material and the plurality of photodiodes, and wherein the isolation structures extend from within the semiconductor material into the insulating material through the surface of the semiconductor material;
metal caps disposed in the insulating material and optically aligned with the isolation structures;
control circuitry electrically coupled to control operation of the plurality of photodiodes; and
readout circuitry to extract image charge from the plurality of photodiodes, wherein the surface is a backside of the semiconductor material, and wherein image light enters the plurality of photodiodes from the backside of the semiconductor material, and wherein metal interconnects included in the control circuitry and readout circuitry are disposed proximate to a frontside opposite the backside.

16. The imaging system of claim 15, further comprising second isolation structures disposed in the semiconductor material and in a second insulating material disposed proximate to the frontside, wherein the second isolation structures extend from within the second insulating material into the semiconductor material.

17. The imaging system of claim 16, wherein both the isolation structures and the second isolation structures are at least in part vertically coextensive with the individual photodiodes in the semiconductor material.

18. The imaging system of claim 16, wherein the second isolation structures are separated from each other in the semiconductor material by a smaller lateral distance than the isolation structures.

* * * * *